United States Patent [19]

Aipperspach et al.

[11] Patent Number: 5,359,557

[45] Date of Patent: Oct. 25, 1994

[54] DUAL-PORT ARRAY WITH STORAGE REDUNDANCY HAVING A CROSS-WRITE OPERATION

[75] Inventors: Anthony G. Aipperspach; Dennis T. Cox, both of Rochester, Minn.

[73] Assignee: International Business Machines Corporation, Armonk, N.Y.

[21] Appl. No.: 986,168

[22] Filed: Dec. 4, 1992

[51] Int. Cl.$^5$ .............................................. G11C 11/40
[52] U.S. Cl. ........................ 365/189.04; 365/230.01; 365/189.01; 365/230.05; 365/230.08
[58] Field of Search ..................... 365/189.04, 230.01, 365/189.01, 230.05, 230.08

[56] References Cited

U.S. PATENT DOCUMENTS

| | | | |
|---|---|---|---|
| 4,008,460 | 2/1977 | Bryant et al. | 340/172.5 |
| 4,410,964 | 10/1983 | Nordling et al. | 365/189 |
| 4,587,637 | 5/1986 | Ishizuka | 365/189.04 |
| 4,616,310 | 10/1986 | Dill et al. | 365/189.04 |
| 4,875,196 | 10/1989 | Spaderna et al. | 365/238 |
| 4,893,279 | 1/1990 | Rahman et al. | 365/230.03 |
| 4,958,326 | 9/1990 | Sakurai | 365/218 |
| 4,975,882 | 12/1990 | Kuo et al. | 365/200 |
| 5,031,146 | 7/1991 | Umina et al. | 365/189.04 |
| 5,175,839 | 12/1992 | Ikeda et al. | 365/189.04 |

FOREIGN PATENT DOCUMENTS 59-151371  8/1984  Japan .

OTHER PUBLICATIONS

IBM Technical Disc. Bulletin vol. 31 No. 3, Aug. 1988, "Error Correction Technique Which Increases Memory Bandwidth and Reduces Access Penalties".

*Primary Examiner*—Viet Q. Nguyen
*Attorney, Agent, or Firm*—J. Michael Anglin; L. Bruce Terry; Andrew J. Dillon

[57] ABSTRACT

A method and system in a data processing system for providing a dual-port memory device having redundant data stored in multiple memory arrays. A first set of data and address latches, coupled to a first data port, are provided for storing data and address information. A second set of data and address latches, coupled to a second data port, are provided for storing data and address information. Each data port is coupled to a memory array. After an external memory access period, a cross-write circuit performs an internal cross-write operation by writing data into a second memory array in response to data previously written to a first memory array and stored in the first set of data and address latches, and writing data into a first memory array in response to data previously written to a second memory array and stored in the second set of data and address latches, wherein a redundant copy of data written to either the first or second memory arrays is created.

15 Claims, 3 Drawing Sheets

DUAL-PORT ARRAY WITH STORAGE REDUNDANCY HAVING A CROSS-WRITE OPERATION

BACKGROUND OF THE INVENTION

1. Technical Field

The present invention relates in general to digital electronic memory devices and in particular to electronic memory devices having redundant data storage. Still more particularly, the present invention relates to electronic memory devices having redundant data storage and dual-port memory access.

2. Description of the Related Art

In high speed data processing systems, cache memory is utilized to decrease the effective time to access data stored in main memory. Cache memory is a buffer that stores selected data copied from a larger and usually slower area of main memory. Cache memory allows the system processor to retrieve data faster than if the processor had to retrieve the data from the main memory. Processor throughput increases as fewer processor machine cycles are wasted waiting for data requested from slower memory. Ideally, a cache memory read or write cycle may be executed within one processor machine cycle. Hence, the processor will not have to wait while a cache memory operation executes. By including cache memory in the data processing system design, processor machine cycles previously spent waiting for data from slower main memory may now be used to perform useful operations.

Processor throughput is only increased, however, if the data requested by the processor is stored within cache memory. The use of cache memory is based upon the principle that certain data has a higher probability at any given time of being selected next by the processor than other data. If such higher probability data are stored in a cache, then average access time for the data will be decreased. Therefore, data is frequently moved into and out of cache memory in an attempt to increase the probability of a cache "hit". A cache hit occurs when the next data required by the processor is located in cache memory and the processor is able to quickly access the data.

Frequently, in an effort to efficiently manage the contents of cache memory, a memory management unit (MMU), or some other device, attempts to shuffle data into and out of cache memory while the central processing unit (CPU) is also attempting to access cache memory. One solution to the need for such simultaneous access to cache memory is to utilize a dual-port memory which allows a single memory array to be accessed simultaneously by two devices. One disadvantage of utilizing a dual-port memory is the high cost associated with a device having a relatively large chip size. Dual-port memory chips may be more than twice as large as a single-port memory chip. A large chip size may reduce manufacturing yield. Manufacturing yield is the ratio of the number of good chips produced to the total number of chips fabricated.

In addition to providing a cache memory having a cycle time as fast as the machine cycle of the main processor, another goal of data processing system design is to protect data integrity and avoid single point failures. One way to accomplish such a goal is to utilize a memory with redundant data storage. Each time data is written to a memory with redundant storage, two copies of the data are stored in two separate memory arrays. If an error is detected in the data in one array (by utilizing a parity check, for example), data from a second array is used instead. The disadvantages of utilizing redundant memory are the size and cost of the memory chip. A redundant memory chip requires two memory arrays, and therefore twice the area on a silicon chip. As discussed above, a larger chip size reduces manufacturing yields, which may increase manufacturing costs.

A conventional data processing system requiring dual-port cache memory with redundant data storage may have to utilize memory chips four times larger than a single-port memory device; dual-port capability may double the chip size and data redundancy may double the size again. Thus, it should be apparent that a need exists for a cache memory having dual-port and redundant storage capability in a configuration that occupies approximately half the space of a conventional memory with the same capability.

SUMMARY OF THE INVENTION

It is therefore one object of the present invention to provide an improved digital electronic memory device.

It is another object of the present invention to provide an improved digital electronic memory device having redundant data storage.

It is yet another object of the present invention to provide an improved electronic memory device having redundant data storage and dual-port memory access.

The foregoing objects are achieved as is now described. A method and system are disclosed in a data processing system for providing a dual-port memory device having redundant data stored in multiple memory arrays. A first set of data and address latches, coupled to a first data port, are provided for storing data and address information. A second set of data and address latches, coupled to a second data port, are provided for storing data and address information. Each data port is coupled to a memory array. After an external memory access period, a cross-write circuit performs an internal cross-write operation by writing data into a second memory array in response to data previously written to a first memory array and stored in the first set of data and address latches, and writing data into a first memory array in response to data previously written to a second memory array and stored in the second set of data and address latches, wherein a redundant copy of data written to either the first or second memory arrays is created.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
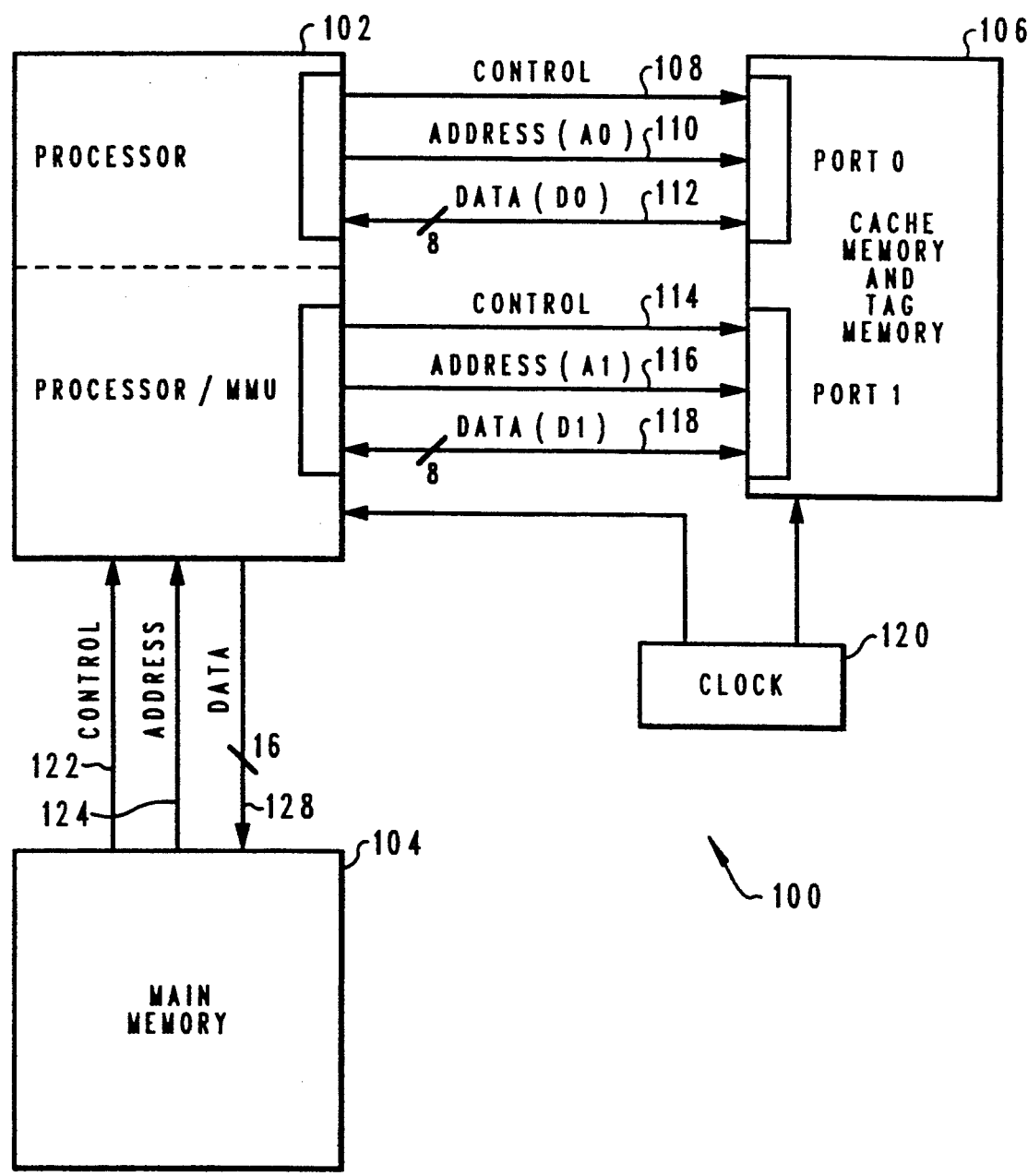
FIG. 1 depicts, in accordance with a preferred embodiment of the present invention, a high level block diagram of a data processing system having a multi-port CPU, a main memory and a dual-port cache memory.

With reference now to the figures and in particular with reference to FIG. 1, there is depicted a high level block diagram of a data processing system having a multi-port CPU, a main memory and a dual-port cache memory, which may be utilized to implement the method and system of the present invention. Data processing system 100 includes processor 102, main memory 104 and cache memory 106. In a preferred embodiment, processor 102 is capable of executing multiple parallel operations, and has three sets of data, address and control lines. Processor 102 is connected to cache memory 106 and main memory 104 via the three separate buses. Two of the three buses are utilized to connect processor 102 to cache memory 106, which is a dual-port memory. Processor 102 is connected to a first port of cache memory 106 by control lines 108, address lines 110, and data lines 112. Processor 102 is connected to a second port of cache memory 106 by control lines 114, address lines 116, and data lines 118. In FIG. 1, the tag memory portion and data memory portion of cache memory 106 are not shown separately. Cache memory 106 may also incorporate a set-associative memory design, which is discussed below.

Processor 102 is connected to main memory 104 via a third data bus, which includes controls lines 122, address lines 124 and data lines 128. In a preferred embodiment of the present invention, data lines 128 are sixteen bits wide and, along with the associated control lines, operate at one-half the data rate of faster data lines 112 and 118. Data lines 112 and 118 are eight bits wide.

Clock 120 is connected to both processor 102 and cache memory 106, and provides a clock signal for synchronization of cache memory access by processor 102.

Processor 102 is preferably a parallel design, and has multiple data ports. Processor 102 is capable of executing multiple parallel operations, and may require simultaneous access to data stored within cache memory 106. A first section of processor 102 may be tasked with executing software instructions, while a second section of processor 102 may be tasked with normal instruction execution and a memory management type function. Such a function includes updating data stored within cache memory 106, thereby supporting software execution within the first section of processor 102. Both ports of processor 102 operate synchronously with cache memory 106 and are synchronized to clock 120. Other arrangements may be used for processor 102, such as two processors operating synchronously or a processor operating in conjunction with a memory management unit.

Figure 2:
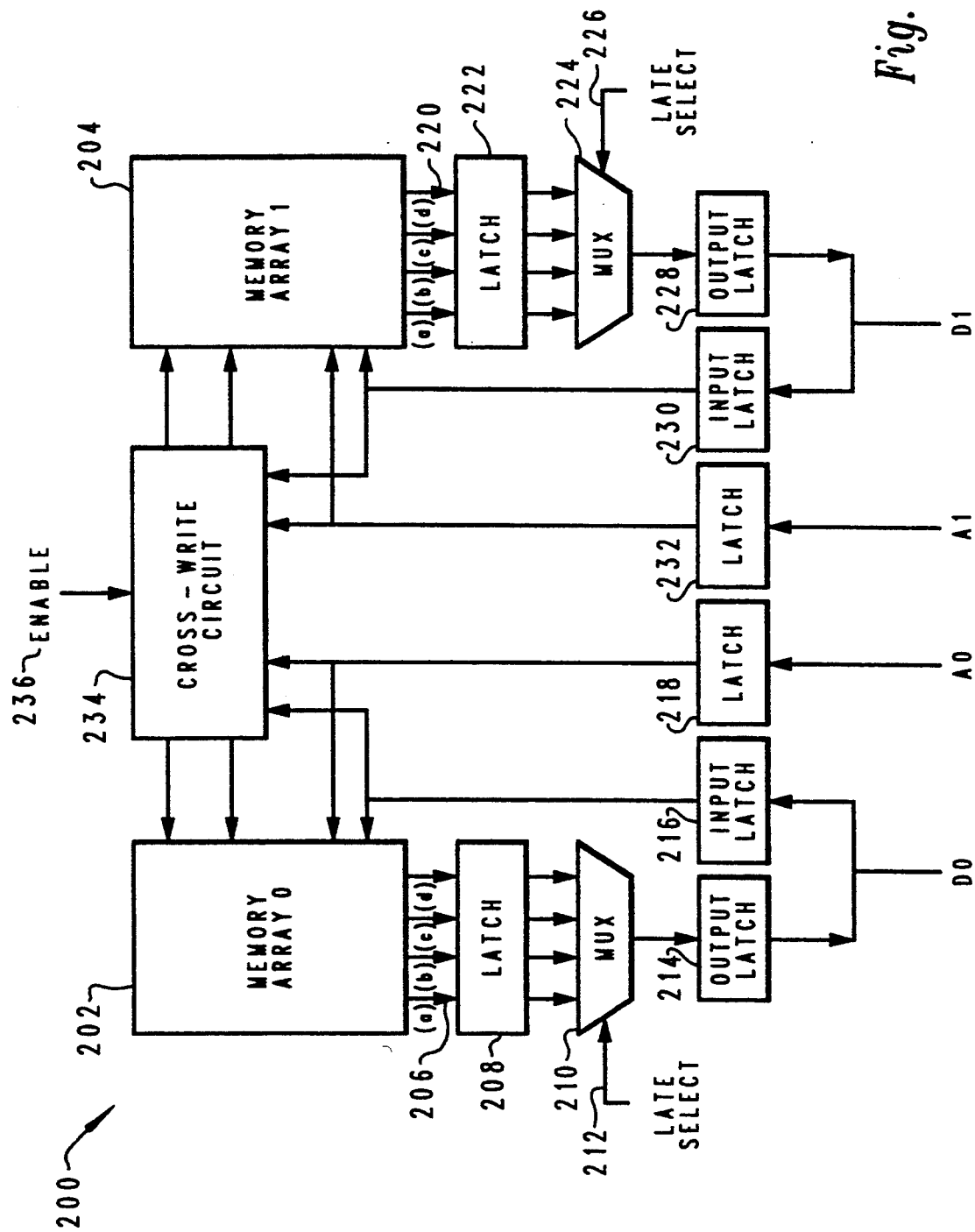
FIG. 2 is a block diagram which further illustrates the details of a cache memory chip utilized to implement the data processing system of FIG. 1.

Referring now to FIG. 2, there is depicted a block diagram which further illustrates the details of a preferred cache memory chip utilized to implement the data processing system of FIG. 1. The tag memory portion of an associative cache memory system is not shown in FIG. 2. Cache memory 200 includes at least two memory arrays: memory array 202 and memory array 204. Although two memory arrays are shown in this example, more than two memory arrays may be utilized in other embodiments of the present invention. Memory array 202 has four data outputs 206 (a), (b), (c), and (d) connected to data latch 208. Each of the four outputs from data latch 208 has nine bits, comprising eight data bits and one parity bit, and provides input data to multiplexer 210. Late select signal 212 provides control signals to multiplexer 210 which selects one of the four inputs to multiplexer 210 to be sent to data output latch 214. Data output latch 214 stores data which is output on lines DO during a read cycle from memory array 202.

Cache memory 200 is designed for a data processing system that utilizes a four-way set-associative cache memory in accordance with a preferred embodiment of the present invention. In a set-associative cache, memory is partitioned into distinct "sets" of "lines," which improves the cache hit ratio. In the present embodiment, four sets of lines are utilized, thereby providing a four-way set associative cache. As the cache memory is accessed, all data lines in a set are read concurrently and then selected by multiplexers 210 and 224, near the end of the read cycle, in response to late select signals 212 and 226. Late select signals 212 and 226 are generated by a tag memory (not shown), and indicate which set matches the requested data. These signals are generated at the end of the tag comparison process, and thus arrive relatively late in the memory address cycle. Generation of such signals by tag memories is known to those skilled in the art of cache design.

During a write cycle to memory array 202, data is stored in data input latch 216. Data input latch 216 is connected to data lines DO and to memory array 202. During a read or a write cycle, address information from address lines AO is stored in address latch 218. Address latch 218 is connected to memory array 202 and provides address information for a memory read or write operation. After data input latch 216 and address latch 218 have latched data and address information, processor 102 may proceed to execute subsequent operations before the write operation to memory array 202 internal to cache memory 200 is complete. Data input latch 216 and address latch 218 also allow processor 102 to avoid two chip crosses per write cycle. A chip cross, which is a communication of data from one device to another, involves a delay inherent in driving a data bus.

Memory array 204 is connected to a set of input and output latches similar to those described above for memory array 202. Memory array 204 has four data outputs 220 (a), (b), (c), and (d), and each nine bit output is connected to data latch 222. Data latch 222 has four data outputs, and all are connected to multiplexer 224. Late select signal 226 is utilized to determine which of the four data inputs to multiplexer 224 will be sent to data output latch 228. Data contained in memory array 204 is read from data output latch 228 on data lines D1. Data lines D1 are also utilized to write data into memory array 204 via data input latch 230. Address latch 232 is utilized to store address information from address lines A1, and is connected to memory array 204.

Cross-write circuit 234 is connected to both memory array 202 and memory array 204. Cross-write circuit 234 is also connected to data input latch 216, address latch 218, address latch 232 and data input latch 230. Cross-write circuit 234 may be enabled or disabled by a signal from cross-write enable 236.

When cross-write circuit 234 is enabled, and immediately following a write cycle to memory array 202, data written to memory array 202 and stored in data input latch 216 at an address stored in address latch 218, is later written into memory array 204 at the memory location stored in address latch 218. Such a cross-write operation stores a redundant copy of data, initially written into memory array 202, into memory array 204. Similarly, if data is written into memory array 204, data stored in data input latch 230 will be later written into memory array 202 at an address stored in address latch 232. All cross-write operations occur during a later portion of a memory cycle, as discussed below, and after an initial write by an external device (an external write).

If processor 102 writes information into memory array 202, and simultaneously writes information into memory array 204 during the same memory cycle, then cross write circuit 234 will update data stored in memory array 202 according to data and address information stored in data input latch 230 and address latch 232, and similarly update memory array 204 according to data and address information stored in data input latch 216 and address latch 218.

Within cache memory 200, the memory cycle, which is defined as the time from the beginning of an external memory access to the beginning of the next possible external memory access, is divided into three subcycles: subcycles 1, 2 and 3. During subcycle 1, processor 102 is permitted to read from, and write to, both memory ports. Subcycle 1 may also be referred to as a memory access period. Thus, processor 102 is permitted access to cache memory 106 once per memory cycle, during the first part of the memory cycle defined as subcycle 1.

The cross-write operation occurs during subcycle 2; that is, after processor 102 writes data into either, or both, memory array 202 or 204, and before the next processor memory cycle. During subcycle 3, cache memory 200 restores (precharges) the bit sense lines, in preparation for a subsequent read operation, unless the previous memory operation was a read operation (hence no cross-write operation during subcycle 2). If a cross-write operation was not performed during subcycle 2, a restore may be performed during subcycle 2 instead of subcycle 3.

Because cross-write operations occur before the next memory access period, memory array 202 and memory array 204 contain the same data information stored at the same corresponding address, except for the situation where processor 102 writes different data words to the same corresponding memory address during the same memory cycle. When different data is written simultaneously to the same location, the data written into memory array 202 is overwritten by the data previously written into memory array 204, and the data previously written into memory array 204 is overwritten by data written into memory array 202. In this case, when different data is simultaneously written to the same location, the cross-write operation destroys data redundancy. In prior art devices, if different data is written to the same memory address, an indeterminate data word may be stored at the specified address. To prevent the destruction of data redundancy, a circuit external to cache memory 200 (not shown) may prevent processor 102 from writing different data into the same location during the same memory cycle by delaying the memory write from one of the ports of processor 102. Such an ability to destroy data redundancy, however, may be used to test circuitry, external to cache memory 200, that is responsible for detecting memory errors.

If processor 102 simultaneously reads cache memory 200 from both ports 0 and 1, cross-write circuit 234 is not required to cross-write any data prior to the next memory access.

Figure 3:
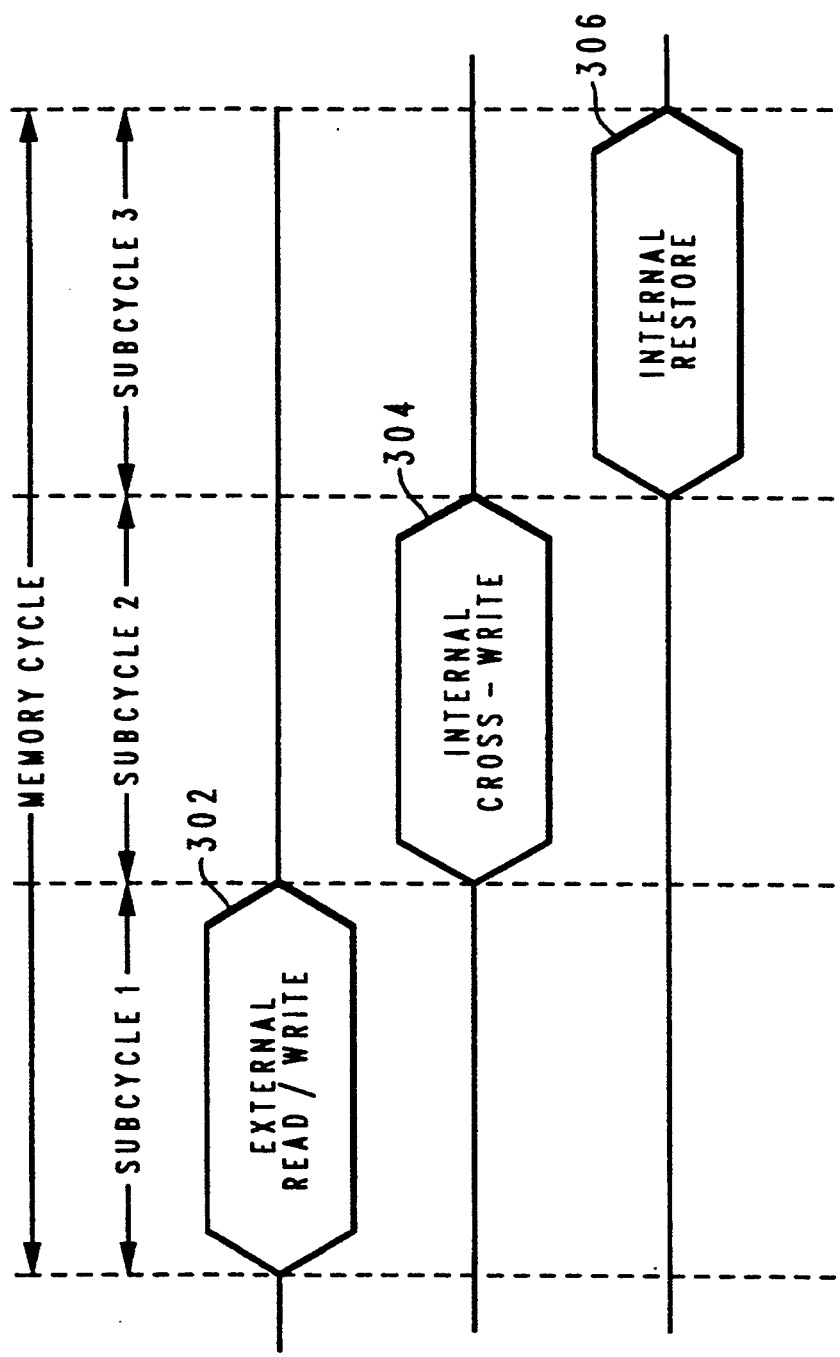
FIG. 3 depicts a timing diagram which further illustrates the operational timing of cache memory 200 of FIG. 2.

Turning now to FIG. 3, there is depicted a timing diagram which further illustrates the operational timing of cache memory 200 of FIG. 2, as described above. FIG. 3 depicts a memory cycle, which is defined as the time from the beginning of an external memory access to the beginning of the next possible external memory access. Within cache memory 200, the memory cycle time is divided into three subcycles: subcycles 1, 2 and 3. Subcycle 1 defines an external memory access period during which external devices, such as central processing units (CPUs), are allowed to read from, or write to, either port of cache memory 200. During subcycle 2, cross-write circuit 234 performs a cross-write operation, if cross-write circuit 234 is enabled and if either port was written to during the preceding subcycle 1. A restore operation (pre-charging the bit-sense lines) may be performed during subcycle 3, or as discussed previously, if no cross-write operation is required to update a particular array during subcycle 2, the restore operation for that particular array may be performed during subcycle 2.

Within cache memory 200, internal access to memory arrays 202 and 204 occurs within the duration of one subcycle, while, from an external viewpoint, access to memory arrays 202 and 204 may occur over the duration of several subcycles. For example, in response to an external read or write, utilizing either port 1 or 2, memory arrays 202 and 204 are read from, or written to, during subcycle 1. Access to either memory array 202 or 204 for a cross-write operation, in response to an external write operation, occurs during subcycle 2. From an external view point, data requested from memory arrays 202 and 204 are stored in data output latches 214 and 228 respectively, and may be read by processor 102 during subcycle 2 or 3, or even later. Thus, data output latches 214 and 228 may provide an external memory access period that is longer than the duration of a single subcycle within cache memory 200.

Address latches 218 and 228 latch address data from processor 102 and allow processor 102 to utilize the address lines for a subsequent operation once the data has been latched. Similarly, data input latches 216 and 230 latch data written to cache memory 200 from processor 102, and allow processor 102 to utilize the data lines for a subsequent operation once the data has been latched.

Table 1 below details operation of cache memory 200 in various read/write situations during dual-port operation. A cross-write operation occurs during subcycle 2 following a write operation to another port during subcycle 1. For example, if memory array 202 was read from port 0 and memory array 204 was written to from port 1, then a cross-write to memory array 202 occurs and memory array 204 may be restored. As discussed above, if a cross-write is not needed during subcycle 2, memory array 202 or 204 may be restored during subcycle 2. If a cross-write is needed during subcycle 2, memory array 202 or 204 may be restored during subcycle 3.

TABLE 1

| | Dual Port Operation | | |
|---|---|---|---|
| Operation | Subcycle 1 | Subcycle 2 | Subcycle 3 |
| Read Port 0 | Read 0 | Restore | — |
| Read Port 1 | Read 1 | Restore | — |
| Read Port 0 | Read 0 | Cross-write 0 from 1 | Restore |

TABLE 1-continued

| | Dual Port Operation | | |
|---|---|---|---|
| Operation | Subcycle 1 | Subcycle 2 | Subcycle 3 |
| Write Port 1 | Write 1 | Restore | — |
| Write Port 0 | Write 0 | Restore | — |
| Read Port 1 | Read 1 | Cross-write 1 from 0 | Restore |
| Write Port 0 | Write 0 | Cross-write 0 from 1 | Restore |
| Write Port 1 | Write 1 | Cross-write 1 from 0 | Restore |

Table 2 below details operation of cache memory 200 in various read/write situations during single-port operation. During single-port operation, both port 1 and 2 are read from, and written to, utilizing the same address, thereby operating as a double wide memory. That is, cache memory 200 behaves as a 32k by 18 bit memory array, instead of a 32k by 9 bit, and cross-write operations are not performed.

TABLE 2

| | Single Port Operation | | |
|---|---|---|---|
| Operation | Subcycle 1 | Subcycle 2 | Subcycle 3 |
| Read Port 0 | Read 0 | Restore | — |
| Read Port 1 | Read 1 | Restore | — |
| Write Port 0 | Write 0 | Restore | — |
| Write Port 1 | Write 1 | Restore | — |

After reading the detailed description of the preferred embodiment above, it should be apparent the present disclosure provides an improved digital memory device having multiple port access and redundant data storage within multiple memory arrays. In the preferred embodiment, the combined features of dual-port access and data redundancy are provided within a chip having an area that may be as small as one half the area of a chip having the same features and employing a conventional design. The smaller chip size and the reduced transistor count may substantially reduce manufacturing cost and increase the reliability of the memory.

Although the memory design of the preferred embodiment utilizes two ports and two memory arrays, it should be understood that additional ports or additional memory arrays may be added without departing from the material features of the present invention. Additional memory subcycles may be added to handle a cross-write operation supporting more than two memory arrays. With reference to the features incorporated to support four-way set-associative cache design, the preferred embodiment may be adapted to support various configurations of cache design.

While the invention has been particularly shown and described with reference to a preferred embodiment, it will be understood by those skilled in the art that various changes in form and detail may be made therein without departing from the spirit and scope of the invention. data storage within multiple memory arrays. In the preferred embodiment, the combined features of dual-port access and data redundancy are provided within a chip having an area that may be as small as one half the area of a chip having the same features and employing a conventional design. The smaller chip size and the reduced transistor count may substantially reduce manufacturing cost and increase the reliability of the memory.

Although the memory design of the preferred embodiment utilizes two ports and two memory arrays, it should be understood that additional ports or additional memory arrays may be added without departing from the material features of the present invention. Additional memory subcycles may be added to handle a cross-write operation supporting more than two memory arrays. With reference to the features incorporated to support four-way set-associative cache design, the preferred embodiment may be adapted to support various configurations of cache design.

While the invention has been particularly shown and described with reference to a preferred embodiment, it will be understood by those skilled in the art that various changes in form and detail may be made therein without departing from the spirit and scope of the invention.

What is claimed is:

1. A dual-port electronic data storage system comprising:
   a first set of data and address latches for storing data and address information;
   a first memory array coupled to said first set of data and address latches;
   a second set of data and address latches for storing data and address information;
   a second memory array coupled to said second set of data and address latches; and
   a cross-write circuit, coupled to said first memory array, said second memory array, said first set of data and address latches and said second set of data and address latches, for performing in a plurality of modes of operation, including:
   a cross-write mode of operation wherein said cross-write circuit automatically:
   (a) writes data stored in a data latch into said second memory array, at a location corresponding to said address information stored in a first address latch, after being initiated by data stored in said first data latch being previously written to said first memory array at a location corresponding to said address information stored in said first address latch; and simultaneously
   (b) writes data stored in a second data latch into said first memory array, at a location corresponding to said address information stored in a second address latch, after being initiated by data stored in said second data latch being previously written to said second memory array at a location corresponding to said address information stored in said second address latch, wherein a redundant copy of data written to either said first or second memory arrays is created.

2. The dual-port electronic data storage system according to claim 1 wherein a memory cycle time is divided into a plurality of subcycles and wherein an external memory access to said first and second memory arrays is permitted only during a selected subcycle.

3. The dual-port electronic data storage system according to claim 2 wherein said cross-write circuit performs in said cross-write mode of operation during a selected memory subcycle.

4. The dual-port electronic data storage system according to claim 1 wherein said cross-write mode of operation may be enabled and disabled in response to a signal coupled to a cross-write enable line.

5. The dual-port electronic data storage system according to claim 5 wherein said dual-port electronic data storage system operates as a conventional single-port memory, having a data word comprised of bits from said first and second memory arrays, in response to said signal coupled to said cross-write enable line.

6. The dual-port electronic data storage system according to claim 1 additionally comprising a multiplexer coupled to each one of said first and second memory arrays for selecting one of a plurality of data output from said first and second memory arrays, in response to a plurality of late select signals coupled to each of said multiplexers.

7. An electronic data storage system comprising:
a plurality of memory arrays;
a first set of data and address latches for storing data and address information utilized to write to one of said plurality of memory arrays;
a second set of data and address latches for storing data and address information utilized to write to one of said plurality of memory arrays; and
means, coupled to said first and second set of data and address latches and said plurality of memory arrays, for automatically modifying data stored in said plurality of memory arrays only in response to said data and address information which was previously utilized to write to one of said plurality of memory arrays, and which was stored in either of said first or second set of data and address latches, wherein a redundant copy of data written to one of said plurality of memory arrays is copied into another of said plurality of memory arrays.

8. The electronic data storage system according to claim 7 wherein said plurality of memory arrays comprises a first memory array and a second memory array.

9. The electronic data storage system according to claim 8 wherein said means for modifying data comprises a cross-write circuit.

10. The electronic data storage system according to claim 9 wherein a memory cycle time is divided into a plurality of subcycles and wherein an external memory access to said first and second memory arrays is permitted only during a selected subcycle.

11. The electronic data storage system according to claim 10 wherein said cross-write circuit performs said cross-write operation between said first and second memory arrays during a selected memory subcycle.

12. The electronic data storage system according to claim 9 additionally comprising a multiplexer coupled to each one of said first and second memory arrays for selecting one of a plurality of data output from said first and second memory arrays, in response to a plurality of late select signals coupled to each of said multiplexers.

13. A method for providing simultaneous access to a redundant data set stored in a memory in a data processing system, said method comprising the steps of:
accessing a first single port memory array during a first portion of a memory cycle;
accessing a second single port memory array during said first portion of said memory cycle; and
automatically performing a cross-write operation during a second portion of said memory cycle in response to a write operation to either of said first or second single port memory arrays, whereby a redundant copy of data written to either said first or second memory arrays is created.

14. A method for providing simultaneous access to a redundant data set stored in a memory in a data processing system according to claim 13 further including the steps of:
storing a data word in a data input latch in response to an external write operation;
storing a data word in a data output latch in response to an external read operation; and
storing an address in an address latch in response to an external read or write operation.

15. A method for providing simultaneous access to a redundant data set stored in a memory in a data processing system according to claim 13 further including the step of precharging bit sense lines within said first and second single port memory arrays after a read operation or after said cross-write operation.

* * * * *